US008258503B2

(12) United States Patent
Gilmartin et al.

(10) Patent No.: US 8,258,503 B2
(45) Date of Patent: Sep. 4, 2012

(54) CHARGE GENERATION LAYER DOPED WITH DIHALOGEN ETHER

(75) Inventors: Brian P. Gilmartin, Williamsville, NY (US); Liang-bih Lin, Rochester, NY (US)

(73) Assignee: Xerox Corporation, Norwalk, CT (US)

( * ) Notice: Subject to any disclaimer, the term of this patent is extended or adjusted under 35 U.S.C. 154(b) by 540 days.

(21) Appl. No.: 12/403,285

(22) Filed: Mar. 12, 2009

(65) Prior Publication Data

US 2010/0230661 A1 Sep. 16, 2010

(51) Int. Cl.
*H01L 51/00* (2006.01)

(52) U.S. Cl. .................................. 257/40; 257/E51.001

(58) Field of Classification Search .................... 257/40, 257/E51.001

See application file for complete search history.

(56) References Cited

U.S. PATENT DOCUMENTS 3,121,006 A 2/1964 Middleton et al.
4,286,033 A 8/1981 Neyhart et al.
4,291,110 A 9/1981 Lee
4,338,387 A 7/1982 Hewitt
4,464,450 A 8/1984 Teuscher
4,587,189 A 5/1986 Hor et al.
4,664,995 A 5/1987 Horgan et al.
4,921,773 A 5/1990 Melnyk et al.
5,069,993 A 12/1991 Robinette et al.
5,153,094 A 10/1992 Kazmaier et al.
5,166,339 A 11/1992 Duff et al.
5,189,155 A 2/1993 Mayo et al.
5,189,156 A 2/1993 Mayo et al.
5,215,839 A 6/1993 Yu
5,660,961 A 8/1997 Yu
5,756,245 A 5/1998 Esteghamatian et al.
5,958,638 A 9/1999 Katayama et al.
2007/0026330 A1* 2/2007 Wu et al. .................... 430/58.05
2007/0292782 A1* 12/2007 Wu et al. ...................... 430/58.8
2007/0292783 A1* 12/2007 Wu et al. ...................... 430/58.8
2007/0292787 A1* 12/2007 Wu et al. ...................... 430/58.8
2007/0292788 A1* 12/2007 Wu et al. ...................... 430/58.8
2007/0292789 A1* 12/2007 Wu et al. ...................... 430/58.8
2007/0292792 A1* 12/2007 Wu et al. ...................... 430/58.8
2007/0292793 A1* 12/2007 Wu et al. ...................... 430/58.8
2010/0068639 A1* 3/2010 Gilmartin et al. ............ 430/59.5

* cited by examiner

*Primary Examiner* — Kenneth Parker
*Assistant Examiner* — Anthony Ho
(74) *Attorney, Agent, or Firm* — Pillsbury Winthrop Shaw Pittman LLP

(57) ABSTRACT

The presently disclosed embodiments relate generally to layers that are useful in imaging apparatus members and components, for use in electrostatographic, including digital, apparatuses. More particularly, the embodiments pertain to an improved electrostatographic imaging member incorporating dihalogen ether into the charge generating layer which results in increased photosensitivity of the photogenerating pigment.

12 Claims, 2 Drawing Sheets

CHARGE GENERATION LAYER DOPED WITH DIHALOGEN ETHER

BACKGROUND

The presently disclosed embodiments relate generally to layers that are useful in imaging apparatus members and components, for use in electrostatographic, including digital, apparatuses. More particularly, the embodiments pertain to an improved electrostatographic imaging member incorporating a dihalogen ether into the charge generating layer which results in enhanced photosensitivity of the hydroxygallium phthalocyanine pigment.

Electrophotographic imaging members, e.g., photoreceptors, photoconductors, and the like, include a photoconductive layer formed on an electrically conductive substrate. The photoconductive layer is an insulator in the substantial absence of light so that electric charges are retained on its surface. Upon exposure to light, charge is generated by the photoactive pigment, and under applied field charge moves through the photoreceptor and the charge is dissipated.

In electrophotography, also known as xerography, electrophotographic imaging or electrostatographic imaging, the surface of an electrophotographic plate, drum, belt or the like (imaging member or photoreceptor) containing a photoconductive insulating layer on a conductive layer is first uniformly electrostatically charged. The imaging member is then exposed to a pattern of activating electromagnetic radiation, such as light. Charge generated by the photoactive pigment moves under the force of the applied field. The movement of the charge through the photoreceptor selectively dissipates the charge on the illuminated areas of the photoconductive insulating layer while leaving behind an electrostatic latent image. This electrostatic latent image may then be developed to form a visible image by depositing oppositely charged particles on the surface of the photoconductive insulating layer. The resulting visible image may then be transferred from the imaging member directly or indirectly (such as by a transfer or other member) to a print substrate, such as transparency or paper. The imaging process may be repeated many times with reusable imaging members.

Multilayered photoreceptors or imaging members have at least two layers, and may include a substrate, a conductive layer, an optional undercoat layer (sometimes referred to as a "charge blocking layer" or "hole blocking layer"), an optional adhesive layer, a photogenerating layer (sometimes referred to as a "charge generation layer," "charge generating layer," or "charge generator layer"), a charge transport layer, and an optional overcoating layer in either a flexible belt form or a rigid drum configuration. In the multilayer configuration, the active layers of the photoreceptor are the charge generation layer (CGL) and the charge transport layer (CTL). Enhancement of charge transport across these layers provides better photoreceptor performance. Multilayered flexible photoreceptor members may include an anti-curl layer on the backside of the substrate, opposite to the side of the electrically active layers, to render the desired photoreceptor flatness.

Hydroxygallium phthalocyanine (HOGaPc) is one of the best photogenarting pigments for use in xerography. The pigment is highly sensitive with a collection efficiency of over 70% of the theoretical maximum at 780 nm. Conventional ways to enhance the photosensitivity (i.e., the slope of the initial photodischarge curve plotted as surface potential vs. exposure, or the amount of exposure required to discharge the surface potential of the imaging member to say ½ or ⅞ of the initial voltage) of HOGaPc involve modification to protocols during pigment preparation—optimization of sensitivity through synthesis, conversion and preparation of the pigment. However, improvement of the conventional procedures has been maximized and thus alternative measures are needed to continue improvement of photosensitivity.

Conventional photoreceptors are disclosed in the following patents, a number of which describe the presence of light scattering particles in the undercoat layers: Yu, U.S. Pat. No. 5,660,961; Yu, U.S. Pat. No. 5,215,839; and Katayama et al., U.S. Pat. No. 5,958,638. The term "photoreceptor" or "photoconductor" is generally used interchangeably with the terms "imaging member." The term "electrostatographic" includes "electrophotographic" and "xerographic." The terms "charge transport molecule" are generally used interchangeably with the terms "hole transport molecule."

SUMMARY

According to aspects illustrated herein, there is an imaging member comprising a substrate, and a charge generation, wherein the charge generation layer comprises hydroxygallium phthalocyanine doped with dihalogen ether and further wherein the imaging member exhibits increased photosensitivity.

Another embodiment provides an imaging member comprising a substrate, and a charge generation layer disposed on the undercoat layer, wherein the charge generation layer is formed from a formulation comprising a dispersion of hydroxygallium phthalocyanine and a poly(vinyl chloride/vinyl acetate) copolymer and doped with dihalogen ether, and further wherein the imaging member exhibits increased photosensitivity.

Yet another embodiment, there is an image forming apparatus for forming images on a recording medium comprising a) an imaging member having a charge retentive-surface for receiving an electrostatic latent image thereon, wherein the imaging member comprises a substrate, and a charge generation layer disposed on the undercoat layer, wherein the charge generation layer comprises hydroxygallium phthalocyanine doped with dihalogen ether, and further wherein the imaging member exhibits increased photosensitivity, b) a development component for applying a developer material to the charge-retentive surface to develop the electrostatic latent image to form a developed image on the charge-retentive surface, c) a transfer component for transferring the developed image from the charge-retentive surface to a copy substrate; and d) a fusing component for fusing the developed image to the copy substrate.

BRIEF DESCRIPTION OF THE DRAWINGS

For a better understanding, reference may be made to the accompanying figures.

DETAILED DESCRIPTION

Figure 1:
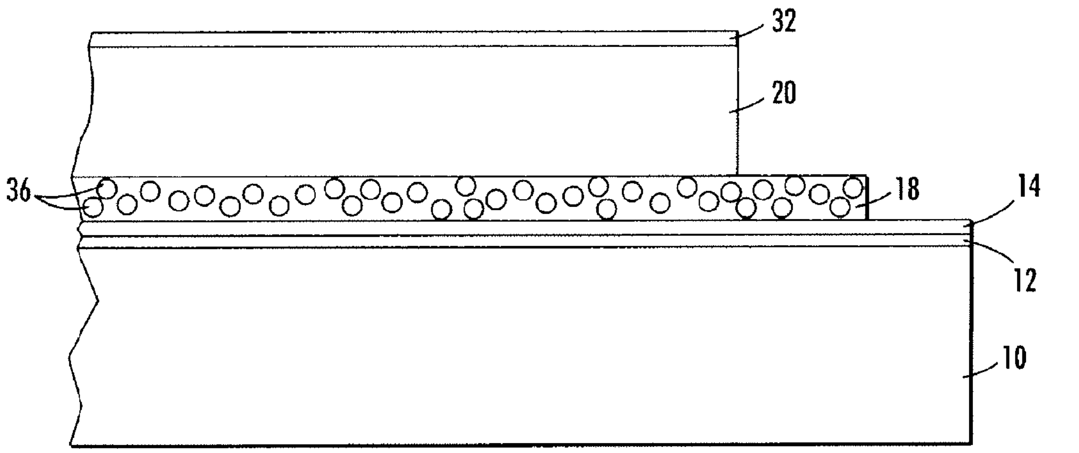
FIG. 1 is a cross-sectional view of an imaging member in a drum configuration according to the present embodiments.

In the following description, reference is made to the accompanying drawings, which form a part hereof and which illustrate several embodiments. It is understood that other embodiments may be used and structural and operational changes may be made without departure from the scope of the present disclosure.

The presently disclosed embodiments are directed generally to an improved electrostatographic imaging member in which the charge generating layer is doped with dihalogen ether in specific amounts. The imaging members having such a charge generating layer exhibits improved photosensitivity that exceeds that attained through conventional methods.

In electrostatographic reproducing or digital printing apparatuses using a photoreceptor, a light image is recorded in the form of an electrostatic latent image upon a photosensitive member and the latent image is subsequently rendered visible by the application of a developer mixture. The developer, having toner particles contained therein, is brought into contact with the electrostatic latent image to develop the image on an electrostatographic imaging member which has a charge-retentive surface. The developed toner image can then be transferred to a copy substrate, such as paper, that receives the image via a transfer member.

The exemplary embodiments of this disclosure are described below with reference to the drawings. The specific terms are used in the following description for clarity, selected for illustration in the drawings and not to define or limit the scope of the disclosure. The same reference numerals are used to identify the same structure in different figures unless specified otherwise. The structures in the figures are not drawn according to their relative proportions and the drawings should not be interpreted as limiting the disclosure in size, relative size, or location. In addition, though the discussion will address negatively charged systems, the imaging members of the present disclosure may also be used in positively charged systems.

FIG. 1 is an exemplary embodiment of a multilayered electrophotographic imaging member having a drum configuration. As can be seen, the exemplary imaging member includes a rigid support substrate 10, an undercoat layer 14, a charge generation layer 18 and a charge transport layer 20. The rigid substrate may be comprised of a material selected from the group consisting of a metal, metal alloy, aluminum, zirconium, niobium, tantalum, vanadium, hafnium, titanium, nickel, stainless steel, chromium, tungsten, molybdenum, and mixtures thereof. The charge generation layer 18 and the charge transport layer 20 forms an imaging layer described here as two separate layers. In an alternative to what is shown in the figure, the charge generation layer may also be disposed on top of the charge transport layer. It will be appreciated that the functional components of these layers may alternatively be combined into a single layer.

The Overcoat Layer

Other layers of the imaging member may include, for example, an optional over coat layer 32. An optional overcoat layer 32, if desired, may be disposed over the charge transport layer 20 to provide imaging member surface protection as well as improve resistance to abrasion. In embodiments, the overcoat layer 32 may have a thickness ranging from about 0.1 micrometer to about 10 micrometers or from about 1 micrometer to about 10 micrometers, or in a specific embodiment, about 3 micrometers. These overcoating layers may include thermoplastic organic polymers or inorganic polymers that are electrically insulating or slightly semi-conductive. For example, overcoat layers may be fabricated from a dispersion including a particulate additive in a resin. Suitable particulate additives for overcoat layers include metal oxides including aluminum oxide, non-metal oxides including silica or low surface energy polytetrafluoroethylene (PTFE), and combinations thereof. Suitable resins include those described above as suitable for photogenerating layers and/or charge transport layers, for example, polyvinyl acetates, polyvinylbutyrals, polyvinylchlorides, vinylchloride and vinyl acetate copolymers, carboxyl-modified vinyl chloride/vinyl acetate copolymers, hydroxyl-modified vinyl chloride/vinyl acetate copolymers, carboxyl- and hydroxyl-modified vinyl chloride/vinyl acetate copolymers, polyvinyl alcohols, polycarbonates, polyesters, polyurethanes, polystyrenes, polybutadienes, polysulfones, polyarylethers, polyarylsulfones, polyethersulfones, polyethylenes, polypropylenes, polymethylpentenes, polyphenylene sulfides, polysiloxanes, polyacrylates, polyvinyl acetals, polyamides, polyimides, amino resins, phenylene oxide resins, terephthalic acid resins, phenoxy resins, epoxy resins, phenolic resins, polystyrene and acrylonitrile copolymers, poly-N-vinylpyrrolidinones, acrylate copolymers, alkyd resins, cellulosic film formers, poly(amideimide), styrene-butadiene copolymers, vinylidenechloride-vinylchloride copolymers, vinylacetate-vinylidenechloride copolymers, styrene-alkyd resins, polyvinylcarbazoles, and combinations thereof. Overcoating layers may be continuous and have a thickness of at least about 0.5 micrometer, or no more than 10 micrometers, and in further embodiments have a thickness of at least about 2 micrometers, or no more than 6 micrometers.

The Substrate

The photoreceptor support substrate 10 may be opaque or substantially transparent, and may comprise any suitable organic or inorganic material having the requisite mechanical properties. The entire substrate can comprise the same material as that in the electrically conductive surface, or the electrically conductive surface can be merely a coating on the substrate. Any suitable electrically conductive material can be employed, such as for example, metal or metal alloy. Electrically conductive materials include copper, brass, nickel, zinc, chromium, stainless steel, conductive plastics and rubbers, aluminum, semitransparent aluminum, steel, cadmium, silver, gold, zirconium, niobium, tantalum, vanadium, hafnium, titanium, nickel, niobium, stainless steel, chromium, tungsten, molybdenum, paper rendered conductive by the inclusion of a suitable material therein or through conditioning in a humid atmosphere to ensure the presence of sufficient water content to render the material conductive, indium, tin, metal oxides, including tin oxide and indium tin oxide, and the like. It could be single metallic compound or dual layers of different metals and/or oxides.

The substrate 10 can also be formulated entirely of an electrically conductive material, or it can be an insulating material including inorganic or organic polymeric materials, such as MYLAR, a commercially available biaxially oriented polyethylene terephthalate from DuPont, or polyethylene naphthalate available as KALEDEX 2000, with a ground plane layer 12 comprising a conductive titanium or titanium/zirconium coating, otherwise a layer of an organic or inorganic material having a semiconductive surface layer, such as indium tin oxide, aluminum, titanium, and the like, or exclusively be made up of a conductive material such as, aluminum, chromium, nickel, brass, other metals and the like. The thickness of the support substrate depends on numerous factors, including mechanical performance and economic considerations.

Figure 2:
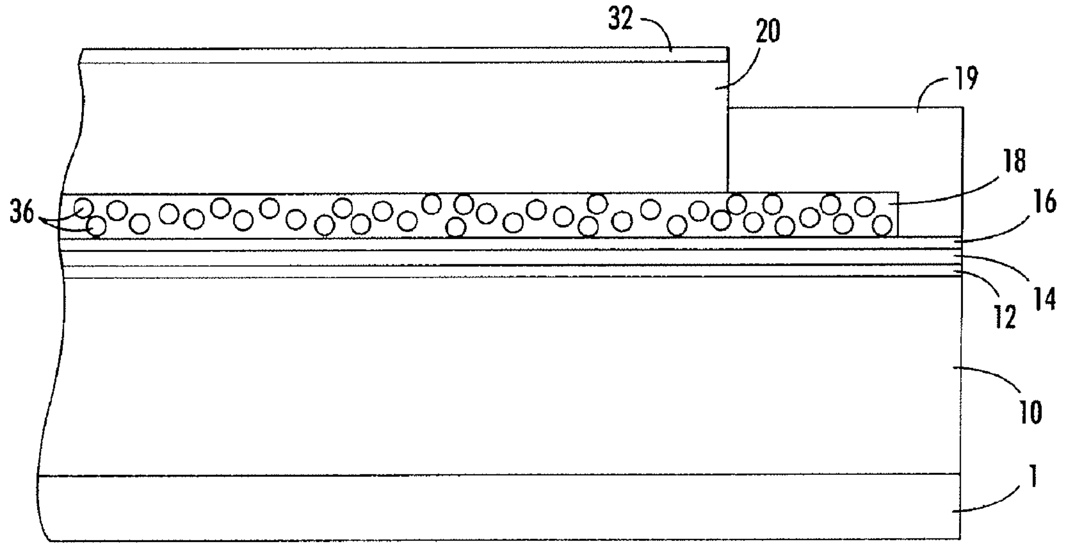
FIG. 2 is a cross-sectional view of an imaging member in a belt configuration according to the present embodiments.

The substrate 10 may have a number of many different configurations, such as for example, a plate, a cylinder, a drum, a scroll, an endless flexible belt, and the like. In the case of the substrate being in the form of a belt, as shown in FIG. 2, the belt can be seamed or seamless. In embodiments, the photoreceptor herein is in a drum configuration.

The thickness of the substrate 10 depends on numerous factors, including flexibility, mechanical performance, and economic considerations. The thickness of the support substrate 10 of the present embodiments may be at least about 500 micrometers, or no more than about 3,000 micrometers, or be at least about 750 micrometers, or no more than about 2500 micrometers.

An exemplary substrate support 10 is not soluble in any of the solvents used in each coating layer solution, is optically transparent or semi-transparent, and is thermally stable up to a high temperature of about 150° C. A substrate support 10 used for imaging member fabrication may have a thermal contraction coefficient ranging from about $1\times10^{-5}$ per ° C. to about $3\times10^{-5}$ per ° C. and a Young's Modulus of between about $5\times10^{-5}$ psi ($3.5\times10^{-4}$ Kg/cm$^2$) and about $7\times10^{-5}$ psi ($4.9\times10^{-4}$ Kg/cm $^2$).

The Ground Plane

The electrically conductive ground plane 12 may be an electrically conductive metal layer which may be formed, for example, on the substrate 10 by any suitable coating technique, such as a vacuum depositing technique. Metals include aluminum, zirconium, niobium, tantalum, vanadium, hafnium, titanium, nickel, stainless steel, chromium, tungsten, molybdenum, and other conductive substances, and mixtures thereof. The conductive layer may vary in thickness over substantially wide ranges depending on the optical transparency and flexibility desired for the electrophotoconductive member. Accordingly, for a flexible photoresponsive imaging device, the thickness of the conductive layer may be at least about 20 Angstroms, or no more than about 750 Angstroms, or at least about 50 Angstroms, or no more than about 200 Angstroms for an optimum combination of electrical conductivity, flexibility and light transmission.

Regardless of the technique employed to form the metal layer, a thin layer of metal oxide forms on the outer surface of most metals upon exposure to air. Thus, when other layers overlying the metal layer are characterized as "contiguous" layers, it is intended that these overlying contiguous layers may, in fact, contact a thin metal oxide layer that has formed on the outer surface of the oxidizable metal layer. Generally, for rear erase exposure, a conductive layer light transparency of at least about 15 percent is desirable. The conductive layer need not be limited to metals. Other examples of conductive layers may be combinations of materials such as conductive indium tin oxide as transparent layer for light having a wavelength between about 4000 Angstroms and about 9000 Angstroms or a conductive carbon black dispersed in a polymeric binder as an opaque conductive layer.

The Hole Blocking Layer

After deposition of the electrically conductive ground plane layer, the hole blocking layer 14 may be applied thereto. Electron blocking layers for positively charged photoreceptors allow holes from the imaging surface of the photoreceptor to migrate toward the conductive layer. For negatively charged photoreceptors, any suitable hole blocking layer capable of forming a barrier to prevent hole injection from the conductive layer to the opposite photoconductive layer may be utilized. The hole blocking layer may include polymers such as polyvinylbutryral, epoxy resins, polyesters, polysiloxanes, polyamides, polyurethanes and the like, or may be nitrogen containing siloxanes or nitrogen containing titanium compounds such as trimethoxysilyl propylene diamine, hydrolyzed trimethoxysilyl propyl ethylene diamine, N-beta-(aminoethyl)gamma-amino-propyl trimethoxy silane, isopropyl 4-aminobenzene sulfonyl, di(dodecylbenzene sulfonyl)titanate, isopropyl di(4-aminobenzoyl)isostearoyl titanate, isopropyl tri(N-ethylamino-ethylamino)titanate, isopropyl trianthranil titanate, isopropyl tri(N,N-dimethyl-ethylamino)titanate, titanium-4-amino benzene sulfonate oxyacetate, titanium 4-aminobenzoate isostearate oxyacetate, $[H_2N(CH_2)_4]CH_3Si(OCH_3)_2$, (gamma-aminobutyl) methyl diethoxysilane, and $[H_2N(CH_2)_3]CH_3Si(OCH_3)_2$ (gamma-aminopropyl)methyl diethoxysilane, as disclosed in U.S. Pat. Nos. 4,338,387, 4,286,033 and 4,291,110.

General embodiments of the undercoat layer may comprise a metal oxide and a resin binder. The metal oxides that can be used with the embodiments herein include, but are not limited to, titanium oxide, zinc oxide, tin oxide, aluminum oxide, silicon oxide, zirconium oxide, indium oxide, molybdenum oxide, and mixtures thereof. Undercoat layer binder materials may include, for example, polyesters, MOR-ESTER 49,000 from Morton International Inc., VITEL PE-100, VITEL PE-200, VITEL PE-200D, and VITEL PE-222 from Goodyear Tire and Rubber Co., polyarylates such as ARDEL from AMOCO Production Products, polysulfone from AMOCO Production Products, polyurethanes, and the like.

The hole blocking layer should be continuous and have a thickness of less than about 0.5 micrometer because greater thicknesses may lead to undesirably high residual voltage. A hole blocking layer of between about 0.005 micrometer and about 0.3 micrometer is used because charge neutralization after the exposure step is facilitated and optimum electrical performance is achieved. A thickness of between about 0.03 micrometer and about 0.06 micrometer is used for hole blocking layers for optimum electrical behavior. The blocking layer may be applied by any suitable conventional technique such as spraying, dip coating, draw bar coating, gravure coating, silk screening, air knife coating, reverse roll coating, vacuum deposition, chemical treatment and the like. For convenience in obtaining thin layers, the blocking layer is applied in the form of a dilute solution, with the solvent being removed after deposition of the coating by conventional techniques such as by vacuum, heating and the like. Generally, a weight ratio of hole blocking layer material and solvent of between about 0.05:100 to about 0.5:100 is satisfactory for spray coating.

The Charge Generation Layer

The charge generation layer 18 may thereafter be applied to the undercoat layer 14. Any suitable charge generation binder including a charge generating/photoconductive material, which may be in the form of particles and dispersed in a film forming binder, such as an inactive resin, may be utilized. Examples of charge generating materials include, for example, inorganic photoconductive materials such as amorphous selenium, trigonal selenium, and selenium alloys selected from the group consisting of selenium-tellurium, selenium-tellurium-arsenic, selenium arsenide and mixtures thereof, and organic photoconductive materials including various phthalocyanine pigments such as the X-form of metal free phthalocyanine, metal phthalocyanines such as vanadyl phthalocyanine and copper phthalocyanine, hydroxygallium phthalocyanines, chlorogallium phthalocyanines, titanyl phthalocyanines, quinacridones, dibromo anthanthrone pigments, benzimidazole perylene, substituted 2,4-diamino-triazines, polynuclear aromatic quinones, enzimidazole perylene, and the like, and mixtures thereof, dispersed in a film forming polymeric binder. Selenium, selenium alloy, benzimidazole perylene, and the like and mixtures thereof may be formed as a continuous, homogeneous charge generation layer. Benzimidazole perylene compositions are well known and described, for example, in U.S. Pat. No. 4,587,189, the entire disclosure thereof being incorporated herein by reference. Multi-charge generation layer compositions may be used where a photoconductive layer enhances or reduces the properties of the charge generation layer. Other suitable charge generating materials known in the art may also be utilized, if desired. The charge generating materials selected should be sensitive to activating radiation having a wavelength between about 400 and about 900 nm during the imagewise radiation exposure step in an electrophotographic imaging process to form an electrostatic latent image. For example, hydroxygallium phthalocyanine absorbs light of a wavelength of from about 370 to about 950 nanometers, as disclosed, for example, in U.S. Pat. No. 5,756,245.

A number of titanyl phthalocyanines, or oxytitanium phthalocyanines for the photoconductors illustrated herein are photogenerating pigments known to absorb near infrared light around 800 nanometers, and may exhibit improved sensitivity compared to other pigments, such as, for example, hydroxygallium phthalocyanine. Generally, titanyl phthalocyanine is known to have five main crystal forms known as Types I, II, III, X, and IV. For example, U.S. Pat. Nos. 5,189,155 and 5,189,156, the disclosures of which are totally incorporated herein by reference, disclose a number of methods for obtaining various polymorphs of titanyl phthalocyanine. Additionally, U.S. Pat. Nos. 5,189,155 and 5,189,156 are directed to processes for obtaining Types I, X, and IV phthalocyanines. U.S. Pat. No. 5,153,094, the disclosure of which is totally incorporated herein by reference, relates to the preparation of titanyl phthalocyanine polymorphs including Types I, II, III, and IV polymorphs. U.S. Pat. No. 5,166,339, the disclosure of which is totally incorporated herein by reference, discloses processes for preparing Types I, IV, and X titanyl phthalocyanine polymorphs, as well as the preparation of two polymorphs designated as Type Z-1 and Type Z-2.

Any suitable inactive resin materials may be employed as a binder in the charge generation layer 18, including those described, for example, in U.S. Pat. No. 3,121,006, the entire disclosure thereof being incorporated herein by reference. Organic resinous binders include thermoplastic and thermosetting resins such as one or more of polycarbonates, polyesters, polyamides, polyurethanes, polystyrenes, polyarylethers, polyarylsulfones, polybutadienes, polysulfones, polyethersulfones, polyethylenes, polypropylenes, polyimides, polymethylpentenes, polyphenylene sulfides, polyvinyl butyral, polyvinyl acetate, polysiloxanes, polyacrylates, polyvinyl acetals, polyamides, polyimides, amino resins, phenylene oxide resins, terephthalic acid resins, epoxy resins, phenolic resins, polystyrene and acrylonitrile copolymers, polyvinylchloride, vinylchloride and vinyl acetate copolymers, acrylate copolymers, alkyd resins, cellulosic film formers, poly(amideimide), styrene-butadiene copolymers, vinylidenechloride/vinylchloride copolymers, vinylacetate/vinylidene chloride copolymers, styrene-alkyd resins, and the like. Another film-forming polymer binder is PCZ-400 (poly(4,4'-dihydroxy-diphenyl-1-1-cyclohexane) which has a viscosity-molecular weight of 40,000 and is available from Mitsubishi Gas Chemical Corporation (Tokyo, Japan).

The charge generating material can be present in the resinous binder composition in various amounts. Generally, at least about 5 percent by volume, or no more than about 90 percent by volume of the charge generating material is dispersed in at least about 95 percent by volume, or no more than about 10 percent by volume of the resinous binder, and more specifically at least about 20 percent, or no more than about 60 percent by volume of the charge generating material is dispersed in at least about 80 percent by volume, or no more than about 40 percent by volume of the resinous binder composition.

In specific embodiments, the charge generation layer 18 may have a thickness of at least about 0.1 μm, or no more than about 2 μm, or of at least about 0.2 μm, or no more than about 1 μm. These embodiments may be comprised of chlorogallium phthalocyanine or hydroxygallium phthalocyanine or mixtures thereof. The charge generation layer 18 containing the charge generating material and the resinous binder material generally ranges in thickness of at least about 0.1 μm, or no more than about 5 μm, for example, from about 0.2 μm to about 3 μm when dry. The charge generation layer thickness is generally related to binder content. Higher binder content compositions generally employ thicker layers for charge generation.

It was discovered that by incorporating dihalogen ether 36 into the charge generation layer 18 of an imaging member, the resulting imaging member exhibited much improved photosensitivity. Incorporating these compounds 36 into the charge generation layer 18 demonstrated increased photosensitivity of the hydroxygallium phthalocyanine pigment in the charge generation layer at levels not attained through conventional methods and also without any adverse impact on the xerographic performance.

Rather than modifying the protocols for preparation of the hydroxygallium phthalocyanine pigment, the addition of dopants to the charge generator layer with the pigment was performed in an effort to increase the sensitivity of the photoconductor. Several ligands with various chemical compositions were screened in experiments and demonstrated that those photoconductor devices doped with a dihalogen ether exhibited optimized sensitivity. In embodiments, the dihalogen ether has the general formula shown below:

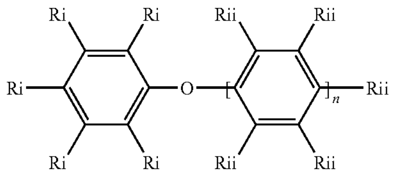

wherein n is between 1 and 3, and $R_i$ and $R_{ii}$ are independently selected from the group consisting of at least one of hydrogen, alkyl, alkenyl, alkoxy, halogen, and the derivatives thereof.

In a particular embodiment, the dihalogen ether used is Bis(p-iodophenyl)ether (IPE) represented by the molecular structure below:

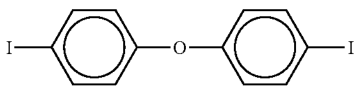

In other embodiments, the dihalogen ether is selected from the group consisting of amines, ethers, alcohols, halides, pyridines, bipyridines, phosphines, phenols, phenyl amines, phenyl halides, benzyl alcohols, benzylamines, benzyl halides, quinones, xylenes, and mixtures thereof. Some other examples of compounds that could be used as potential dopants in this system are 1,3,5-tribromo-2-(4-bromophenoxy)benzene or 1,4-Bis(bromophenoxy)benzene. The present embodiments incorporating such compounds in the charge generation layer exhibited an increase in photosensitivity of from about 14% to about 17%.

FIG. 2 shows an imaging member having a belt configuration according to the embodiments. As shown, the belt configuration is provided with an anti-curl back coating 1, a supporting substrate 10, an electrically conductive ground plane 12, an undercoat layer 14, an adhesive layer 16, a charge generation layer 18, and a charge transport layer 20. The charge generation layer 18 is doped with dihalogen ether compound 36. In embodiments, the dihalogen ether 36 is present in an amount of from about 0.005% to about 40 wt % of the total weight of the charge generation layer 18. In other embodiments, the dihalogen ether 36 is present in an amount of from about 0.001% to about 75 wt % of the total weight of the charge generation layer 18. In specific embodiments, a weight/weight ratio of the dihalogen ether to the hydroxygallium phthalocyanine pigment is from about 2.5/97.5 to about 50/50. In other embodiments, the dihalogen ether is present in the charge generation layer in an amount of about 0.1 wt % to about 150 wt % relative to the hydroxygallium phthalocyanine.

The charge generation layer 18 may also include, in embodiments, a vinyl resin wherein a weight/weight ratio of the hydroxygallium phthalocyanine to the vinyl resin is from about 5/95 to about 95/5. In one embodiment, the vinyl resin is a high molecular weight vinyl resin such as poly(vinyl chloride/vinyl acetate) copolymer (VMCH), available from Union Carbide (Houston, Tex.).

An optional overcoat layer 32 and ground strip 19 may also be included. An exemplary photoreceptor having a belt configuration is disclosed in U.S. Pat. No. 5,069,993, which is hereby incorporated by reference.

The Charge Transport Layer

In a drum photoreceptor, the charge transport layer comprises a single layer of the same composition. As such, the charge transport layer will be discussed specifically in terms of a single layer 20, but the details will be also applicable to an embodiment having dual charge transport layers. The charge transport layer 20 is thereafter applied over the charge generation layer 18 and may include any suitable transparent organic polymer or non-polymeric material capable of supporting the injection of photogenerated holes or electrons from the charge generation layer 18 and capable of allowing the transport of these holes/electrons through the charge transport layer to selectively discharge the surface charge on the imaging member surface. In one embodiment, the charge transport layer 20 not only serves to transport holes, but also protects the charge generation layer 18 from abrasion or chemical attack and may therefore extend the service life of the imaging member. The charge transport layer 20 can be a substantially non-photoconductive material, but one which supports the injection of photogenerated holes from the charge generation layer 18.

The layer 20 is normally transparent in a wavelength region in which the electrophotographic imaging member is to be used when exposure is affected there to ensure that most of the incident radiation is utilized by the underlying charge generation layer 18. The charge transport layer should exhibit excellent optical transparency with negligible light absorption and no charge generation when exposed to a wavelength of light useful in xerography, e.g., 400 to 900 nanometers. In the case when the photoreceptor is prepared with the use of a transparent substrate 10 and also a transparent or partially transparent conductive layer 12, image wise exposure or erase may be accomplished through the substrate 10 with all light passing through the back side of the substrate. In this case, the materials of the layer 20 need not transmit light in the wavelength region of use if the charge generation layer 18 is sandwiched between the substrate and the charge transport layer 20. The charge transport layer 20 in conjunction with the charge generation layer 18 is an insulator to the extent that an electrostatic charge placed on the charge transport layer is not conducted in the absence of illumination. The charge transport layer 20 should trap minimal charges as the charge passes through it during the discharging process.

The charge transport layer 20 may include any suitable charge transport component or activating compound useful as an additive dissolved or molecularly dispersed in an electrically inactive polymeric material, such as a polycarbonate binder, to form a solid solution and thereby making this material electrically active. "Dissolved" refers, for example, to forming a solution in which the small molecule is dissolved in the polymer to form a homogeneous phase; and molecularly dispersed in embodiments refers, for example, to charge transporting molecules dispersed in the polymer, the small molecules being dispersed in the polymer on a molecular scale. The charge transport component may be added to a film forming polymeric material which is otherwise incapable of supporting the injection of photogenerated holes from the charge generation material and incapable of allowing the transport of these holes through. This addition converts the electrically inactive polymeric material to a material capable of supporting the injection of photogenerated holes from the charge generation layer 18 and capable of allowing the transport of these holes through the charge transport layer 20 in order to discharge the surface charge on the charge transport layer. The high mobility charge transport component may comprise small molecules of an organic compound which cooperate to transport charge between molecules and ultimately to the surface of the charge transport layer. For example, but not limited to, N,N'-diphenyl-N,N-bis(3-methyl phenyl)-1,1'-biphenyl-4,4'-diamine (TPD), other arylamines like triphenyl amine, N,N,N',N'-tetra-p-tolyl-1,1'-biphenyl-4,4'-diamine (TM-TPD), and the like.

A number of charge transport compounds can be included in the charge transport layer, which layer generally is of a thickness of from about 5 to about 75 micrometers, and more specifically, of a thickness of from about 15 to about 40 micrometers. Examples of charge transport components are aryl amines of the following formulas/structures:

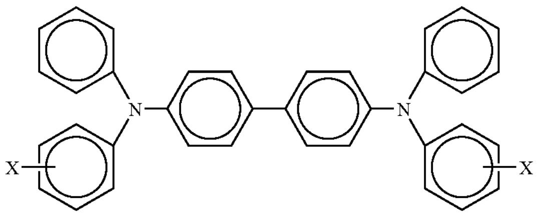

and

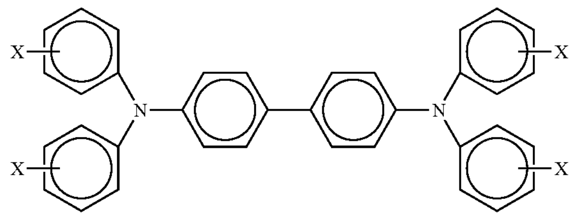

wherein X is a suitable hydrocarbon like alkyl, alkoxy, aryl, and derivatives thereof; a halogen, or mixtures thereof, and especially those substituents selected from the group consisting of Cl and $CH_3$; and molecules of the following formulas

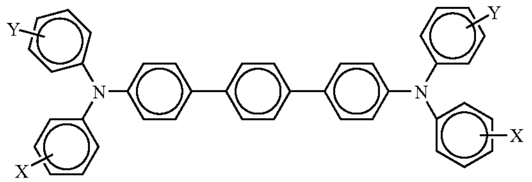

and

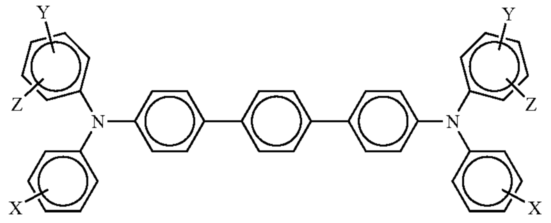

wherein X, Y and Z are independently alkyl, alkoxy, aryl, a halogen, or mixtures thereof, and wherein at least one of Y and Z are present.

Alkyl and alkoxy contain, for example, from 1 to about 25 carbon atoms, and more specifically, from 1 to about 12 carbon atoms, such as methyl, ethyl, propyl, butyl, pentyl, and the corresponding alkoxides. Aryl can contain from 6 to about 36 carbon atoms, such as phenyl, and the like. Halogen includes chloride, bromide, iodide, and fluoride. Substituted alkyls, alkoxys, and aryls can also be selected in embodiments.

Examples of specific aryl amines that can be selected for the charge transport layer include N,N'-diphenyl-N,N'-bis(alkylphenyl)-1,1-biphenyl-4,4'-diamine wherein alkyl is selected from the group consisting of methyl, ethyl, propyl, butyl, hexyl, and the like; N,N'-diphenyl-N,N'-bis(halophenyl)-1,1'-biphenyl-4,4'-diamine wherein the halo substituent is a chloro substituent; N,N'-bis(4-butylphenyl)-N,N'-di-p-tolyl-[p-terphenyl]-4,4"-diamine, N,N'-bis(4-butylphenyl)-N,N'-di-m-tolyl-[p-terphenyl]-4,4"-diamine, N,N'-bis(4-butylphenyl)-N,N'-di-o-tolyl-[p-terphenyl]-4,4"-diamine, N,N'-bis(4-butylphenyl)-N,N'-bis-(4-isopropylphenyl)-[p-terphenyl]-4,4"-diamine, N,N'-bis(4-butylphenyl)-N,N'-bis-(2-ethyl-6-methylphenyl)-[p-terphenyl]-4,4"-diamine, N,N'-bis(4-butylphenyl)-N,N'-bis-(2,5-dimethylphenyl)-[p-terphenyl]-4,4'-diamine, N,N'-diphenyl-N,N'-bis(3-chlorophenyl)-[p-terphenyl]-4,4"-diamine, and the like. Other known charge transport layer molecules may be selected in embodiments, reference for example, U.S. Pat. Nos. 4,921,773 and 4,464,450, the disclosures of which are totally incorporated herein by reference.

Examples of the binder materials selected for the charge transport layers include components, such as those described in U.S. Pat. No. 3,121,006, the disclosure of which is totally incorporated herein by reference. Specific examples of polymer binder materials include polycarbonates, polyarylates, acrylate polymers, vinyl polymers, cellulose polymers, polyesters, polysiloxanes, polyamides, polyurethanes, poly(cyclo olefins), and epoxies, and random or alternating copolymers thereof. In embodiments, the charge transport layer, such as a hole transport layer, may have a thickness of at least about 10 μm, or no more than about 40 μm.

Examples of components or materials optionally incorporated into the charge transport layers or at least one charge transport layer to, for example, enable improved lateral charge migration (LCM) resistance include hindered phenolic antioxidants such as tetrakis methylene(3,5-di-tert-butyl-4-hydroxy hydrocinnamate)methane (IRGANOX® 1010, available from Ciba Specialty Chemical), butylated hydroxytoluene (BHT), and other hindered phenolic antioxidants including SUMILIZER™ BHT-R, MDP-S, BBM-S, WX-R, NW, BP-76, BP-101, GA-80, GM and GS (available from Sumitomo Chemical Co., Ltd.), IRGANOX® 1035, 1076, 1098, 1135, 1141, 1222, 1330, 1425WL, 1520L, 245, 259, 3114, 3790, 5057 and 565 (available from Ciba Specialties Chemicals), and ADEKA STAB™ AO-20, AO30, AO-40, AO-50, AO-60, AO-70, AO-80 and AO-330 (available from Asahi Denka Co., Ltd.); hindered amine antioxidants such as SANOL™ LS-2626, LS-765, LS-770 and LS-744 (available from SANKYO CO., Ltd.), TINUVIN® 144 and 622LD (available from Ciba Specialties Chemicals), MARK™ LA57, LA67, LA62, LA68 and LA63 (available from Asahi Denka Co., Ltd.), and SUMILIZER® TPS (available from Sumitomo Chemical Co., Ltd.); thioether antioxidants such as SUMILIZER® TP-D (available from Sumitomo Chemical Co., Ltd); phosphite antioxidants such as MARK™ 2112, PEP-8, PEP-24G, PEP-36, 329K and HP-10 (available from Asahi Denka Co., Ltd.); other molecules such as bis(4-diethylamino-2-methylphenyl)phenylmethane (BDETPM), bis-[2-methyl-4-(N-2-hydroxyethyl-N-ethyl-aminophenyl)]-phenylmethane (DHTPM), and the like. The weight percent of the antioxidant in at least one of the charge transport layer is from about 0 to about 20, from about 1 to about 10, or from about 3 to about 8 weight percent.

The charge transport layer should be an insulator to the extent that the electrostatic charge placed on the hole transport layer is not conducted in the absence of illumination at a rate sufficient to prevent formation and retention of an electrostatic latent image thereon. The charge transport layer is substantially nonabsorbing to visible light or radiation in the region of intended use, but is electrically "active" in that it allows the injection of photogenerated holes from the photoconductive layer, that is the charge generation layer, and allows these holes to be transported through itself to selectively discharge a surface charge on the surface of the active layer.

Any suitable and conventional technique may be utilized to form and thereafter apply the charge transport layer mixture to the supporting substrate layer. The charge transport layer may be formed in a single coating step or in multiple coating steps. Dip coating, ring coating, spray, gravure or any other drum coating methods may be used.

Drying of the deposited coating may be effected by any suitable conventional technique such as oven drying, infrared radiation drying, air drying and the like. The thickness of the charge transport layer after drying is from about 10 μm to about 40 μm or from about 12 μm to about 36 μm for optimum photoelectrical and mechanical results. In another embodiment the thickness is from about 14 μm to about 36 μm.

The Adhesive Layer

An optional separate adhesive interface layer may be provided in certain configurations, such as for example, in flexible web configurations. In the embodiment illustrated in FIG. 1, the interface layer would be situated between the blocking layer 14 and the charge generation layer 18. The interface layer may include a copolyester resin. Exemplary polyester resins which may be utilized for the interface layer include polyarylatepolyvinylbutyrals, such as ARDEL POLYARYLATE (U-100) commercially available from Toyota Hsutsu Inc., VITEL PE-100, VITEL PE-200, VITEL PE-200D, and VITEL PE-222, all from Bostik, 49,000 polyester from Rohm & Haas, polyvinyl butyral, and the like. The adhesive interface layer may be applied directly to the hole blocking layer 14. Thus, the adhesive interface layer in embodiments is in direct contiguous contact with both the underlying hole blocking layer 14 and the overlying charge generator layer 18 to enhance adhesion bonding to provide linkage. In yet other embodiments, the adhesive interface layer is entirely omitted.

Any suitable solvent or solvent mixtures may be employed to form a coating solution of the polyester for the adhesive interface layer. Solvents may include tetrahydrofuran, toluene, monochlorbenzene, methylene chloride, cyclohexanone, and the like, and mixtures thereof. Any other suitable and conventional technique may be used to mix and thereafter apply the adhesive layer coating mixture to the hole blocking layer. Application techniques may include spraying, dip coating, roll coating, wire wound rod coating, and the like. Drying of the deposited wet coating may be effected by any suitable conventional process, such as oven drying, infrared radiation drying, air drying, and the like.

The adhesive interface layer may have a thickness of at least about 0.01 micrometers, or no more than about 900 micrometers after drying. In embodiments, the dried thickness is from about 0.03 micrometers to about 1 micrometer.

The Ground Strip

The ground strip may comprise a film forming polymer binder and electrically conductive particles. Any suitable electrically conductive particles may be used in the electrically conductive ground strip layer 19. The ground strip 19 may comprise materials which include those enumerated in U.S. Pat. No. 4,664,995. Electrically conductive particles include carbon black, graphite, copper, silver, gold, nickel, tantalum, chromium, zirconium, vanadium, niobium, indium tin oxide and the like. The electrically conductive particles may have any suitable shape. Shapes may include irregular, granular, spherical, elliptical, cubic, flake, filament, and the like. The electrically conductive particles should have a particle size less than the thickness of the electrically conductive ground strip layer to avoid an electrically conductive ground strip layer having an excessively irregular outer surface. An average particle size of less than about 10 micrometers generally avoids excessive protrusion of the electrically conductive particles at the outer surface of the dried ground strip layer and ensures relatively uniform dispersion of the particles throughout the matrix of the dried ground strip layer. The concentration of the conductive particles to be used in the ground strip depends on factors such as the conductivity of the specific conductive particles utilized.

The ground strip layer may have a thickness of at least about 7 micrometers, or no more than about 42 micrometers, or of at least about 14 micrometers, or no more than about 27 micrometers.

The Anti-Curl Back Coating Layer

The anti-curl back coating 1 may comprise organic polymers or inorganic polymers that are electrically insulating or slightly semi-conductive. The anti-curl back coating provides flatness and/or abrasion resistance.

Anti-curl back coating 1 may be formed at the back side of the substrate 10, opposite to the imaging layers. The anti-curl back coating may comprise a film forming resin binder and an adhesion promoter additive. The resin binder may be the same resins as the resin binders of the charge transport layer discussed above. Examples of film forming resins include polyacrylate, polystyrene, bisphenol polycarbonate, poly(4,4'-isopropylidene diphenyl carbonate), 4,4'-cyclohexylidene diphenyl polycarbonate, and the like. Adhesion promoters used as additives include 49,000 (du Pont), Vitel PE-100, Vitel PE-200, Vitel PE-307 (Goodyear), and the like. Usually from about 1 to about 15 weight percent adhesion promoter is selected for film forming resin addition. The thickness of the anti-curl back coating is at least about 3 micrometers, or no more than about 35 micrometers, or about 14 micrometers.

In addition, in the present embodiments using a belt configuration, the charge transport layer may consist of a single pass charge transport layer or a dual pass charge transport layer (or dual layer charge transport layer) with the same or different transport molecule ratios. In these embodiments, the dual layer charge transport layer has a total thickness of from about 10 μm to about 40 μm. In other embodiments, each layer of the dual layer charge transport layer may have an individual thickness of from 2 μm to about 20 μm. Moreover, the charge transport layer may be configured such that it is used as a top layer of the photoreceptor to inhibit crystallization at the interface of the charge transport layer and the overcoat layer. In another embodiment, the charge transport layer may be configured such that it is used as a first pass charge transport layer to inhibit microcrystallization occurring at the interface between the first pass and second pass layers.

Various exemplary embodiments encompassed herein include a method of imaging which includes generating an electrostatic latent image on an imaging member, developing a latent image, and transferring the developed electrostatic image to a suitable substrate.

While the description above refers to particular embodiments, it will be understood that many modifications may be made without departing from the spirit thereof. The accompanying claims are intended to cover such modifications as would fall within the true scope and spirit of embodiments herein.

The presently disclosed embodiments are, therefore, to be considered in all respects as illustrative and not restrictive, the scope of embodiments being indicated by the appended claims rather than the foregoing description. All changes that come within the meaning of and range of equivalency of the claims are intended to be embraced therein.

EXAMPLES

The example set forth herein below and is illustrative of different compositions and conditions that can be used in practicing the present embodiments. All proportions are by weight unless otherwise indicated. It will be apparent, however, that the embodiments can be practiced with many types of compositions and can have many different uses in accordance with the disclosure above and as pointed out hereinafter.

Example 1

Preparation of the Charge Generation Layer:

Charge generation dispersion of hydroxygallium phthalocyanine was first prepared using standard milling techniques at a 60:40 weight ratio of pigment to a poly(vinyl chloride/vinyl acetate) copolymer (VMCH), a high molecular weight vinyl resin available from Union Carbide (Houston, Tex.). Upon completion, the dispersion was separated into several portions. The dihalogen ether chosen for this experiment was Bis(p-iodophenyl)ether (IPE). In each of these samples, IPE was added in weight ratios of 2.5:97.5, 5:95, 10:90, and 50:50 with respect to the pigment. A sampling of the dispersion with no IPE added was used as a control. Imaging members were prepared with a standard configuration of a 10 μm $TiO_2$-based undercoat layer, the CGL with and/or without IPE, and a 24 or 28 μm charge transport layer.

Performance Testing

Figure 3:
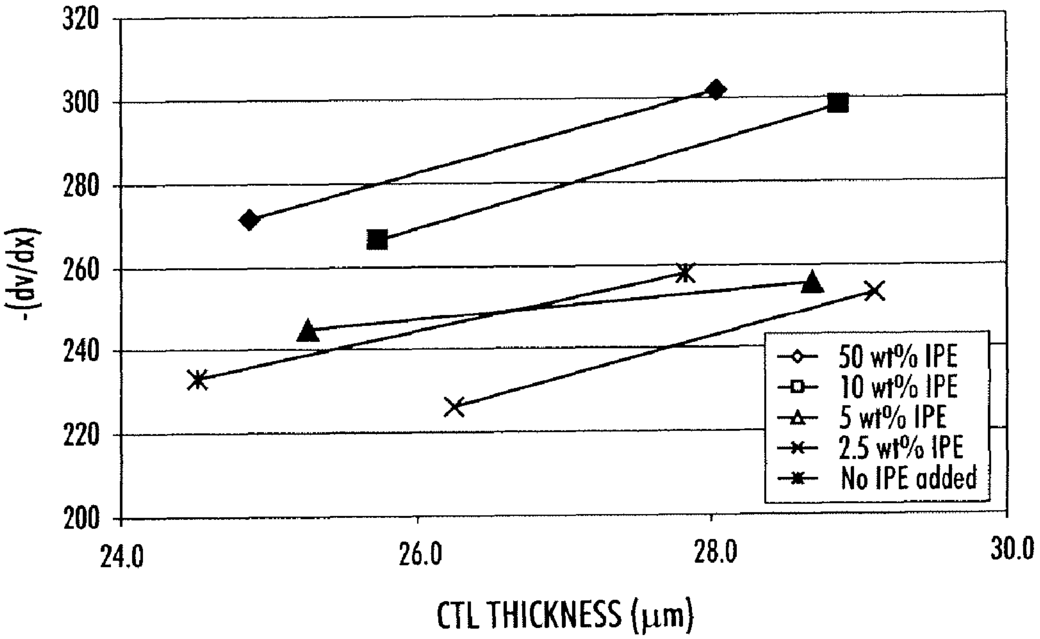
FIG. 3 is a graph illustrating the increase in photosensitivity of imaging members made according to the present embodiments.

As shown in FIG. 3, time zero electrical scanning results show that the photoreceptor sensitivity is significantly increased in the presence of 10 or more weight % IPE with respect to the pigment and CTL thickness within the range of 24 to 28 μm. CTL thickness was determined from the dielectric thickness obtained from charging curves. In order to clearly see the change in sensitivity, a study of the range of CTL thickness was conducted. The photosensitivity increase (measured as the change in—(dv/dx) compared to the control photoreceptor sensitivity with no IPE in the CGL) ranged from about 14% to about 17% with the addition of 10 or 50 weight % IPE in the CGL. No significant changes were observed with the addition of 2.5 or 5 weight % of IPE in the CGL.

Figure 4:
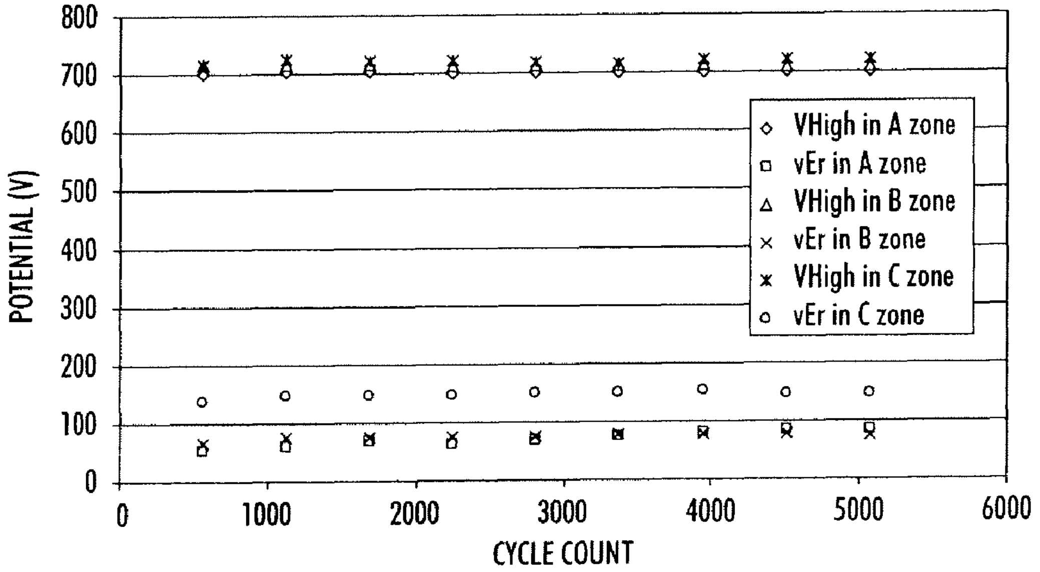
FIG. 4 is a graph illustrating cyclic stability of imaging members made according to the present embodiments.

One of the IPE-doped devices (10 weight % IPE) was also subjected to long-cycle stability tests in various environmental zones, i.e., A (about 28° C., about 57% average relative humidity (ARH)), B (about 22° C., about 51% ARH), and C (about 9° C., about 20% ARH) zones, as shown in FIG. 4. Very stable cycling was achieved in each of these zones with no significant differences in $V_{High}$ or residual potential ($v_{Er}$) observed after several thousand cycles. These results are comparable with undoped devices. Additionally, as shown in Table 1, this same device showed no significant changes in dark decays (i.e., the voltage reduction over approximately 200 ms while the charged photoreceptor is in the dark) and depletion voltages ($v_{Depl}$; the additional voltage required to begin charging the photoreceptor) throughout the cycling test.

TABLE 1

| | A zone | | B zone | | C zone | |
|---|---|---|---|---|---|---|
| Cycle | Dark Decay (V) | $v_{Depl}$ (V) | Dark Decay (V) | $v_{Depl}$ (V) | Dark Decay (V) | $v_{Depl}$ (V) |
| 563 | 14 | 37 | 11 | 27 | 12 | 55 |
| 1126 | 13 | 62 | 12 | 56 | 15 | 71 |
| 1689 | 14 | | 12 | | 14 | |
| 2252 | 14 | | 12 | | 14 | |
| 2815 | 13 | | 13 | | 14 | |
| 3378 | 14 | | 13 | | 14 | |
| 3941 | 15 | | 14 | | 14 | |
| 4504 | 15 | | 14 | | 14 | |
| 5067 | 16 | | 14 | | 16 | |

One possible explanation for the increase in photoconductor sensitivity could be based on the packing of IPE in the inventive devices. With each end of the dihalogen capable of coordinating galliums on two adjacent phthalocyanines, the dopant essentially creates a network path with the phthalocyanine complexes in the CGL, which better facilitates electron-hole dissociation. Consequently, the inventive devices are more readily discharged and the sensitivity increases.

In summary, the sensitivity of photoconductive devices having a charge generation layer comprising hydroxygallium phthalocyanine pigment in the presence of a dihalogen ether was considerably increased without compromising the cyclic stability of the devices. For example, this effect was clearly established when the dopant was added in an amount of 10 weight % relative to the pigment in the CGL.

All the patents and applications referred to herein are hereby specifically, and totally incorporated herein by reference in their entirety in the instant specification.

It will be appreciated that several of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. An imaging member comprising:

a substrate; and a charge generation layer disposed on the substrate, wherein the charge generation layer comprises hydroxygallium phthalocyanine doped with bis (p-iodophenyl) ether represented by the molecular structure below:

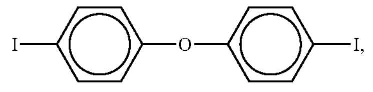

and further wherein the imaging member exhibits increased photosensitivity of from about 14% to about 17% as compared to an imaging member comprising the same charge generation layer without dihalogen ether.

2. The imaging member of claim 1, wherein the dihalogen ether is present in the charge generation layer in an amount of from about 0.001% to about 75% by weight of the total weight of the charge generation layer.

3. The imaging member of claim 1, wherein a weight/weight ratio of the dihalogen ether to the hydroxygallium phthalocyanine pigment is from about 2.5/97.5 to about 50/50.

4. The imaging member of claim 1, wherein the dihalogen ether is present in the charge generation layer in an amount of from about 0.1 wt % to about 150 wt % relative to the hydroxygallium phthalocyanine.

5. The imaging member of claim 1, wherein the substrate is in a belt configuration or a drum configuration.

6. The imaging member of claim 1, wherein the charge generation layer further comprises a vinyl resin.

7. The imaging member of claim 6, wherein a weight/weight ratio of the hydroxygallium phthalocyanine to the vinyl resin is from about 5/95 to about 95/5.

8. The imaging member of claim 6, wherein the charge generation layer has a thickness of from about 0.1 μm to about 2 μm.

9. The imaging member of claim 1, wherein the charge generation layer further comprises a poly(vinyl chloride/vinyl acetate) copolymer.

10. An imaging member comprising:

a substrate;

an undercoat layer disposed on the substrate; and a charge generation layer disposed on the undercoat layer, wherein the charge generation layer is formed from a formulation comprising a dispersion of hydroxygallium phthalocyanine and a poly(vinyl chloride/vinyl acetate) copolymer and doped with bis (p-iodophenyl)ether represented by the molecular structure below:

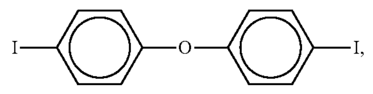

and further wherein the imaging member exhibits increased photosensitivity of from about 14% to about 17% as compared to an imaging member comprising the same charge generation layer without dihalogen ether.

11. The imaging member of claim 10, wherein a weight/weight ratio of the dihalogen ether to the hydroxygallium phthalocyanine pigment is from about 2.5/97.5 to about 50/50.

12. The imaging member of claim 9, wherein a weight/weight ratio of the hydroxygallium phthalocyanine to the poly(vinyl chloride/vinyl acetate) copolymer is from about 5/95 to about 95/5.

* * * * *